(12) United States Patent
Fisher

(10) Patent No.: US 10,535,789 B2
(45) Date of Patent: Jan. 14, 2020

(54) REFRIGERATION FROM GRAPHENE-BASED NANOEMITTERS

(71) Applicant: Purdue Research Foundation, West Lafayette, IN (US)

(72) Inventor: Timothy S. Fisher, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 766 days.

(21) Appl. No.: 14/356,321

(22) PCT Filed: Nov. 4, 2012

(86) PCT No.: PCT/US2012/063480
§ 371 (c)(1),
(2) Date: May 5, 2014

(87) PCT Pub. No.: WO2013/067472
PCT Pub. Date: May 10, 2013

(65) Prior Publication Data
US 2014/0311708 A1 Oct. 23, 2014

Related U.S. Application Data

(60) Provisional application No. 61/555,948, filed on Nov. 4, 2011.

(51) Int. Cl.
*H01L 31/0288* (2006.01)
*C23C 16/26* (2006.01)
(Continued)

(52) U.S. Cl.
CPC ......... *H01L 31/0288* (2013.01); *B82Y 30/00* (2013.01); *B82Y 40/00* (2013.01);
(Continued)

(58) Field of Classification Search
CPC .................................................. H01L 31/0288
See application file for complete search history.

(56) References Cited

U.S. PATENT DOCUMENTS

| | | | |
|---|---|---|---|
| 2003/0151352 A1* | 8/2003 | Yamaguchi | B82Y 10/00 313/495 |
| 2004/0223381 A1* | 11/2004 | Yaniv | B82Y 10/00 365/200 |

(Continued)

OTHER PUBLICATIONS

Palnitkar, U., et al, "Remarkably low turn-on eld emission in undoped, nitrogendoped, and boron-doped graphene," Applied Physics Letters, vol. 97, No. 6, p. 063102, 2010.

(Continued)

*Primary Examiner* — Joseph L Williams
(74) *Attorney, Agent, or Firm* — Purdue Research Foundation

(57) ABSTRACT

This disclosure presents the use of electrons as the 'working fluid' in conjunction with a solid nanomaterial that hinders electron coupling to the atomic lattice of the nanomaterial, i.e., they are out of equilibrium. The electrons can achieve very high effective temperatures with minimal heating of the solid lattice. These 'hot' electrons emit from the absorbing material, carrying both the light energy and energy acquired from the atomic lattice. Thus, the operation of this disclosure includes shining light on an object to make the object cool instead of heat. It is envisioned that one of ordinary skill in the art would find the operation quite counter-intuitive.

9 Claims, 15 Drawing Sheets

(51) Int. Cl.
  C23C 16/56 (2006.01)
  B82Y 30/00 (2011.01)
  B82Y 40/00 (2011.01)
  C01B 32/186 (2017.01)
  C01B 32/194 (2017.01)
(52) U.S. Cl.
  CPC .......... *C01B 32/186* (2017.08); *C01B 32/194* (2017.08); *C23C 16/26* (2013.01); *C23C 16/56* (2013.01)

(56) References Cited

U.S. PATENT DOCUMENTS

2005/0075245 A1* 4/2005 Goddard, III .......... B82Y 30/00 502/417
2010/0206363 A1* 8/2010 Choi ...................... B82Y 30/00 136/252

OTHER PUBLICATIONS

Westover, T., et al, "Photo- and thermionic emission from potassium-intercalated carbon nanotube arrays," Journal of Vacuum Science and Technology B, vol. 28, No. 2, pp. 423-434, 2010.

Mcmullen, K., "Measurement of Thermionic Electron Emission from Modified Graphene Petals," Master's thesis, Purdue University, 2010.

Bhuvana T., et al, "Contiguous petal-like carbon nanosheet outgrowths from graphite fibers by plasma CVD," ACS applied materials & inter-faces, vol. 2, pp. 644-648, Mar. 2010.

Venghaus, H., "Redetermination of the dielectric function of graphite," physica status solidi (b), 1975.

Dawlaty, J., "Measurement of the optical absorption spectra of epitaxial graphene from terahertz to visible," Applied Physics Letters, vol. 93, No. 13, p, 131905, 2008.

Eda, G., et al, "Field emission from graphene based composite thin films,"Applied Physics Letters, vol. 93, No. 23, p. 233502, 2008.

Wu, Z., et al "Field Emission of Single-Layer Graphene Films Prepared by Electrophoretic Deposition," Advanced Materials, vol. 21, pp. 1756-1760, May 2009.

Xiao, Z., et al, "Field electron emission characteristics and physical mechanism of individual single-layer graphene," ACS nano, vol. 4, pp. 6332-6336, Dec. 2010.

Rout, C., et al, "Au nanoparticles on graphitic petal arrays for surface-enhanced Raman spectroscopy," Applied Physics Letters, vol. 97, No. 13, p. 133108, 2010.

Qi, J., et al, "Ar plasma treatment on few layer graphene sheets for enhancing their field emission properties," Journal of Physics D: Applied Physics, vol. 43, pg. 055302, Feb. 2010.

* cited by examiner

REFRIGERATION FROM GRAPHENE-BASED NANOEMITTERS

CROSS REFERENCE TO RELATED APPLICATIONS

This application is a 371 of international application Serial No. PCT/US2012/063480, which claims the benefit of priority to U.S. Provisional Patent Application Ser. No. 61/555,948, filed Nov. 4, 2011, incorporated herein by reference.

FIELD

The scope of this disclosure includes electron photoemission of potassium intercalated graphene-based materials for photovoltaic/thermionic power generation.

BACKGROUND

Traditional absorption refrigeration processes can be driven entirely by heat without the need for intermediate conversion to electrical and/or mechanical power; consequently, the hardware tends to be simpler than competing forms of refrigeration such as vapor-compression cycles. However, evaporative cooling cycles suffer from large volume and only moderate efficiency, and they have, to date, always involved the desorption/adsorption or evaporation/condensation of at least one working fluid.

SUMMARY

This disclosure presents the use of electrons as the 'working fluid' in conjunction with a solid nanomaterial that hinders electron coupling to the atomic lattice of the nanomaterial (i.e., they are out of equilibrium). The electrons can achieve very high effective temperatures with minimal heating of the solid lattice. These 'hot' electrons emit from the absorbing material, carrying both the light energy and energy acquired from the atomic lattice. Even electrons that are insufficiently excited to produce direct emission have a long lifetime and may be re-excited without relaxation such that they can emit. Thus, the operation of this disclosure includes shining light on an object to make the object cool instead of heat. It is envisioned that one of ordinary skill in the art would find the operation quite counter-intuitive.

The present disclosure includes a material comprising: a carbon allotrope doped with boron nitride and an alkali metal intercalated within the carbon allotrope.

The present disclosure also includes a material comprising: a carbon allotrope, the carbon allotrope selected from the group consisting of graphene and graphite, an alkali metal intercalated within the carbon allotrope, the material subjected to irradiation, the irradiation sufficient to emit an electron with non-zero kinetic energy.

The present disclosure also includes a method of producing potassium intercalated graphene, the method comprising, providing a substrate, placing the substrate in a microwave plasma chemical vapor deposition chamber, providing hydrogen gas to the chamber, exposing the substrate to plasma, providing methane gas to the chamber, placing product in an evacuated tube along with potassium metal, heating the metal to produce melting and sublimation such that potassium vapor permeates the tube, maintaining a cold environment near the product such that the potassium condenses on the product, cooling the entire system and removing an intercalated product.

The present disclosure also includes a method of synthesizing boron nitride doped potassium intercalated graphene, the method comprising: providing a substrate, placing the substrate in a microwave plasma chemical vapor deposition chamber, elevating the substrate above a molybdenum puck, providing hydrogen gas to the chamber, exposing the substrate to plasma, providing methane gas to the chamber, placing product in an evacuated tube along with potassium metal, heating the metal to produce melting and sublimation such that potassium vapor permeates the tube, maintaining a cold environment near the product such that the potassium condenses on the product, cooling the entire system and removing an intercalated product.

The present disclosure also includes an apparatus for transferring heat activated by radiation, comprising, a cathode comprising a substrate of graphite, the graphite being intercalated with an alkali metal, the cathode graphite having a plurality of electrons that are not in thermal equilibrium with the cathode graphite lattice, said cathode having opposing inner and outer surfaces; an anode comprising a substrate of graphite, wherein substantially all of the electrons of the anode graphite are in thermal equilibrium with the anode graphite lattice, said anode having opposing inner and outer surfaces; a member maintaining a gap between said cathode inner surface and said anode inner surface, said member being substantially non-conductive of electricity; wherein the transfer of from said cathode to said anode is activated by reception of the radiation on said cathode.

The present disclosure also includes a method for transferring heat activated by radiation, comprising, providing a cathode including graphite and an anode; modifying the graphite to have a plurality of electrons with reduced work function, irradiating the modified cathode with the radiation; emitting the reduced work function electrons from the cathode by said irradiating; receiving the emitted electrons by the anode; and removing heat from the cathode by said emitting.

It will be appreciated that the various apparatus and methods described in this summary section, as well as elsewhere in this application, can be expressed as a large number of different combinations and subcombinations. All such useful, novel, and inventive combinations and subcombinations are contemplated herein, it being recognized that the explicit expression of each of these combinations is unnecessary.

BRIEF DESCRIPTION OF THE DRAWINGS

Some of the figures shown herein may include dimensions. Further, some of the figures shown herein may have been created from scaled drawings or from photographs that are scalable. It is understood that such dimensions, or the relative scaling within a figure, are by way of example, and not to be construed as limiting.

FIG. 3A-2 is a schematic representation of a heat exchanger according to one embodiment of the present disclosure.

DESCRIPTION OF THE PREFERRED EMBODIMENT

Figure 1A:
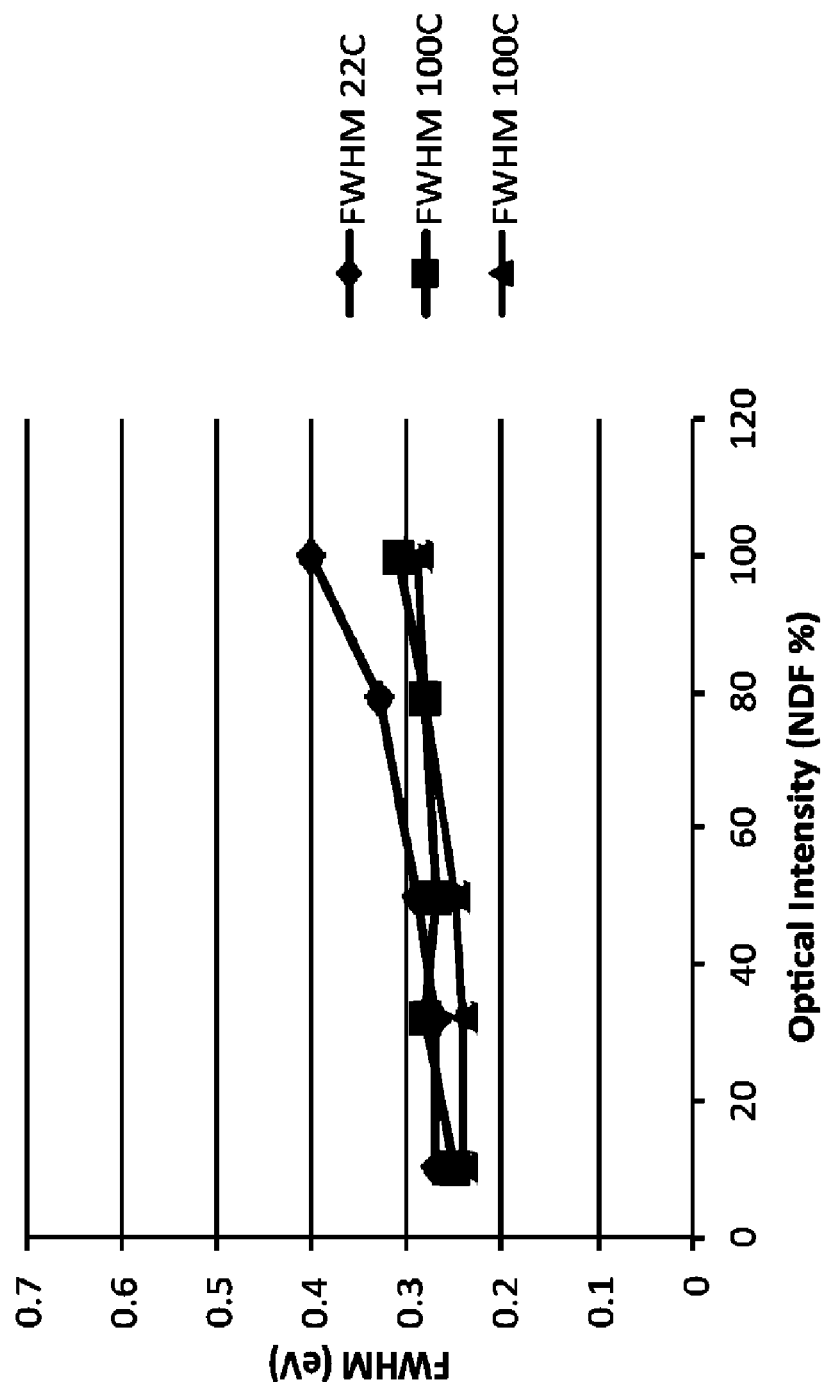
FIG. 1A is a graphical representation of electron energy distribution measurements illustrating FWHM vs. optical intensity of solar simulator for varying emitter temperatures.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates. At least one embodiment of the present invention will be described and shown, and this application may show and/or describe other embodiments of the present invention. It is understood that any reference to "the invention" is a reference to an embodiment of a family of inventions, with no single embodiment including an apparatus, process, or composition that should be included in all embodiments, unless otherwise stated. Further, although there may be discussion with regards to "advantages" provided by some embodiments of the present invention, it is understood that yet other embodiments may not include those same advantages, or may include yet different advantages. Any advantages described herein are not to be construed as limiting to any of the claims.

The use of an N-series prefix for an element number (NXX.XX) refers to an element that is the same as the non-prefixed element (XX.XX), except as shown and described thereafter The usage of words indicating preference, such as "preferably," refers to features and aspects that are present in at least one embodiment, but which are optional for some embodiments. As an example, an element 1020.1 would be the same as element 20.1, except for those different features of element 1020.1 shown and described. Further, common elements and common features of related elements are drawn in the same manner in different figures, and/or use the same symbology in different figures. As such, it is not necessary to describe the features of 1020.1 and 20.1 that are the same, since these common features are apparent to a person of ordinary skill in the related field of technology. This description convention also applies to the use of prime ('), double prime ("), and triple prime (''') suffixed element numbers. Therefore, it is not necessary to describe the features of 20.1, 20.1', 20.1", and 20.1''' that are the same, since these common features are apparent to persons of ordinary skill in the related field of technology.

Although various specific quantities (spatial dimensions, temperatures, pressures, times, force, resistance, current, voltage, concentrations, wavelengths, frequencies, heat transfer coefficients, dimensionless parameters, etc.) may be stated herein, such specific quantities are presented as examples only, and further, unless otherwise noted, are approximate values, and should be considered as if the word "about" prefaced each quantity. Further, with discussion pertaining to a specific composition of matter, that description is by example only, and does not limit the applicability of other species of that composition, nor does it limit the applicability of other compositions unrelated to the cited composition.

What will be shown and described herein, along with various embodiments of the present invention, is discussion of one or more tests that were performed. It is understood that such examples are by way of examples only, and are not to be construed as being limitations on any embodiment of the present invention. It is understood that embodiments of the present invention are not necessarily limited to or described by the mathematical analysis presented herein.

Several embodiments of the present disclosure use electrons as the 'working fluid' using a solid nanomaterial that hinders electron coupling to the atomic lattice (i.e., they are out of equilibrium) such that the electrons can achieve very high effective temperatures with minimal heating of the solid lattice.

Figure 1B:
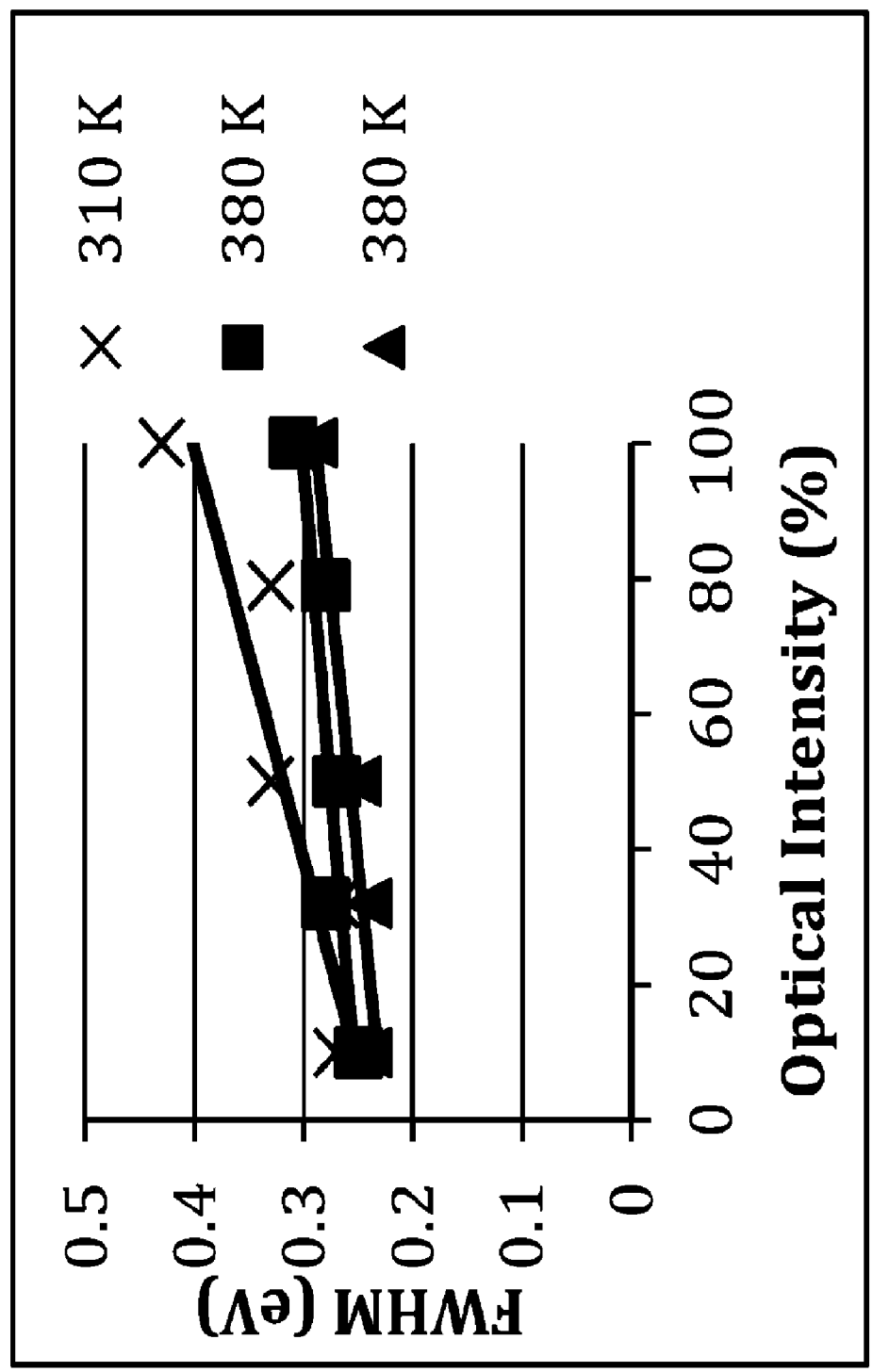
FIG. 1B is another graphical representation of electron energy distribution measurements illustrating FWHM vs. optical intensity of solar simulator for varying emitter temperatures.
Figure 6:
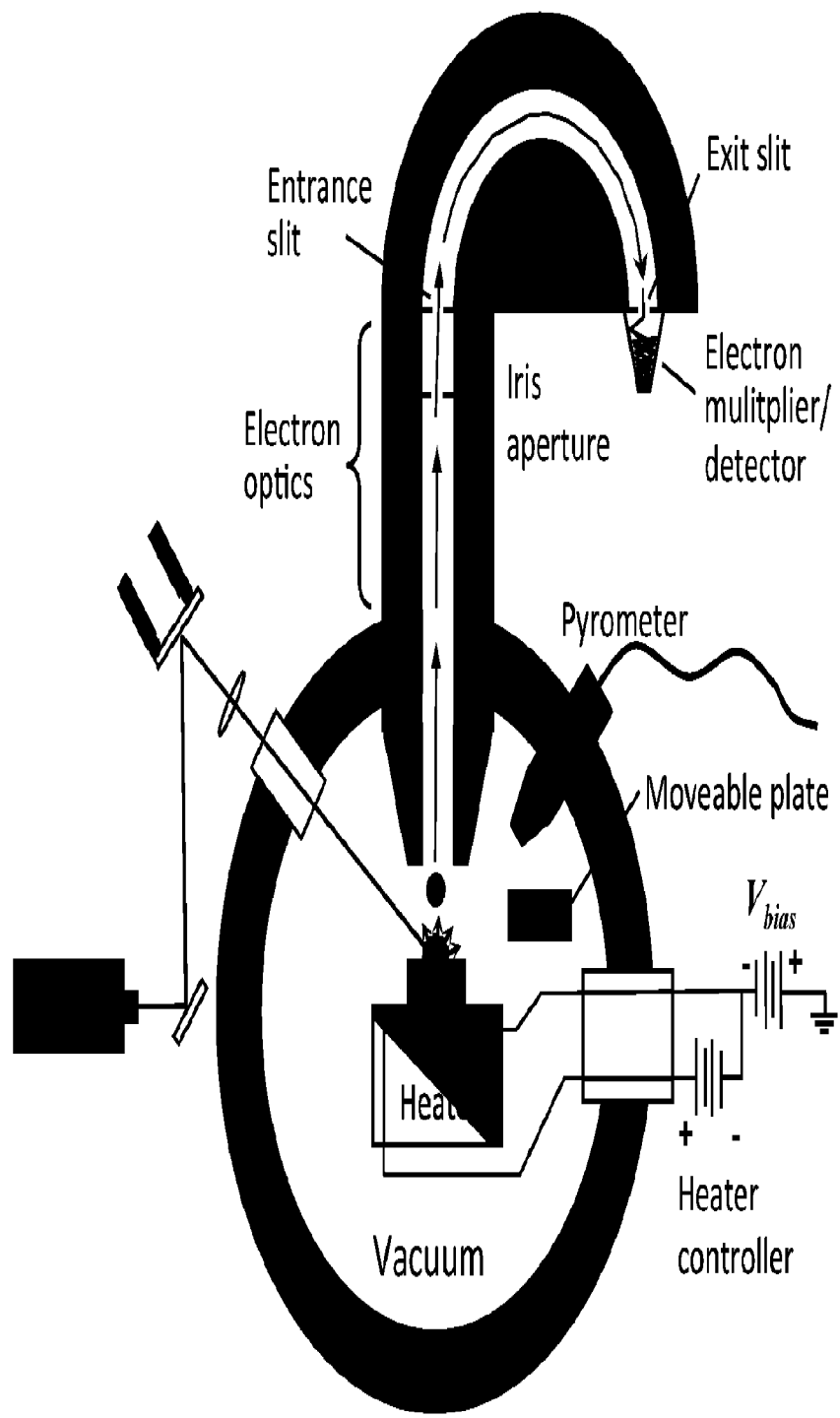
FIG. 6 is a schematic representation of an instrument measuring emission distributions caused by optical and/or thermal excitation.

In this disclosure, photonic irradiation (whether from a solar source including from filtered solar light or from a non-solar source such as a low-cost light emitting diode) provides the energy that heats electrons, with minimal lattice heating. FIGS. 1A and 1B show derived results from electron energy distribution measurements. The abscissa (x) axis represents the percentage of 1 sun as created in the lab by an AM1.5 solar simulator while the vertical scale contains the 'full width half maximum' (FWHM) of the main portion of the electron energy distribution as measured by a specialized instrument in our laboratory. As illustrated in FIG. 6, this instrument is comprised of a custom vacuum system with an electron energy analyzer attached. The emitter sample is situated such that custom optical and thermal excitation can be applied. The electron energy analyzer measures the energy-resolved electron emission distributions caused by optical and/or thermal excitation.

As illustrated in FIG. 1A, the light intensities are low—less than or equal to 1 sun on the surface of the earth. As illustrated in FIG. 1B, the light intensities are still relatively low—less than, equal to, or about 20% more than 1 sun on the surface of the earth.

For such low intensities (<1 sun), only minimal (~10 degrees K) increases in lattice temperature would be expected. The FWHM of the electron distribution is known to be directly proportional to absolute temperature (~300 K at room temperature). Therefore, if the electrons and lattice were in equilibrium (or nearly so), then the increase in the FWHM with increasing light intensity would be envisioned as almost imperceptible on the graph.

However, the experiments shown in FIGS. 1A and 1B illustrate a marked upward trend. In fact, for the unheated sample of FIG. 1A (labeled FWHM 22 C which equals 295 K), the FWHM increases by approximately 50%. The FWHM increase suggests an electron temperature near 500 K. FIG. 1A also illustrates that the heated samples (labeled FWHM 100 C=373 K) show lower FWHM (and thus lower electron temperature) for virtually all intensities. This observation serves to reinforce the central hypothesis because higher lattice temperatures are known to increase electron scattering with lattice energy carriers (called phonons), and this increased coupling would tend to pull the electron temperature closer to the lattice (observed) temperature.

While the light intensities shown are low, it is envisioned that much higher light intensities will perform in a similar or possibly even a better way. We note the non-linearity of FWHM with increasing light intensity in FIGS. 1A and 1B. We envision the possibility of using solar concentration, by any means ranging from parabolic mirrors to microlenses, to enhance this effect.

Additional thermodynamic advantages may be achievable by concentrating the light beyond the 1 sun level. A sketch of concepts involving (a) parabolic mirror concentrator and (b) a microlens array attached to the collector is shown in FIG. 5. The parabolic mirror concept would capture more total light, whereas the microlens array would be very compact and could enhance the local absorption of light to create even higher electron temperatures that would improve thermodynamic efficiency and capacity. We envision that these concentrators could alternatively be located behind the emitter electrode. Regardless the electrode through which light passes would need to be highly transparent.

We envision that the light source need not be solar. If high efficiencies are realized, we envision using a high-efficiency light-emitting diode integrated into or near the emitter substrate as the driving light source for an ultra-compact cooler. Alternatively, we envision the use of very hot thermal sources such as heated refractory materials as the principal source of electromagnetic irradiation.

Graphene has emerged as an important material with diverse prospective applications. Widely used graphene synthesis techniques include: mechanical exfoliation, chemical exfoliation, epitaxial growth over SiC, and chemical vapor deposition (CVD). Mechanical exfoliation was the first reported technique and gives high-quality films. Both chemical exfoliation and SiC growth are multistep processes. The CVD technique is a single-step process and offers promise for large-scale graphene growth and meeting the projected demand for graphene production.

Figure 2A:
FIG. 2A is a scanning electron microscope photographic representation of graphene petals.
Figure 2B:
FIG. 2B is another scanning electron microscope photographic representation of graphene petals.

It is envisioned that nanoscale thin-graphite (or multi-layer graphene) petals absorb the light and transfer the photonic energy to electronic energy. The nanoscale thin-graphite (or multi-layer graphene) petals that cover surface as shown in FIGS. 2A and 2B. The petals are pre-treated with potassium (K), which becomes intercalated between the graphite or graphene layers in order to decrease the energy required for electrons to emit (the so-called work function, φ). The work function is the minimum energy that must be given to an electron to liberate it from the surface of a particular substance. The photoelectric work function is:

$$\phi = hf_0$$

where h is Planck constant and $f_0$ is the minimum (threshold) frequency of the photon required to produce photoelectric emission.

In the photoelectric effect, electron excitation is achieved by absorption of a photon. If the photon's energy is greater than the substance's work function, photoelectric emission occurs and the electron is liberated from the surface. As is well understood, excess photon energy results in a liberated electron with non-zero kinetic energy.

Figures 1, 3A:
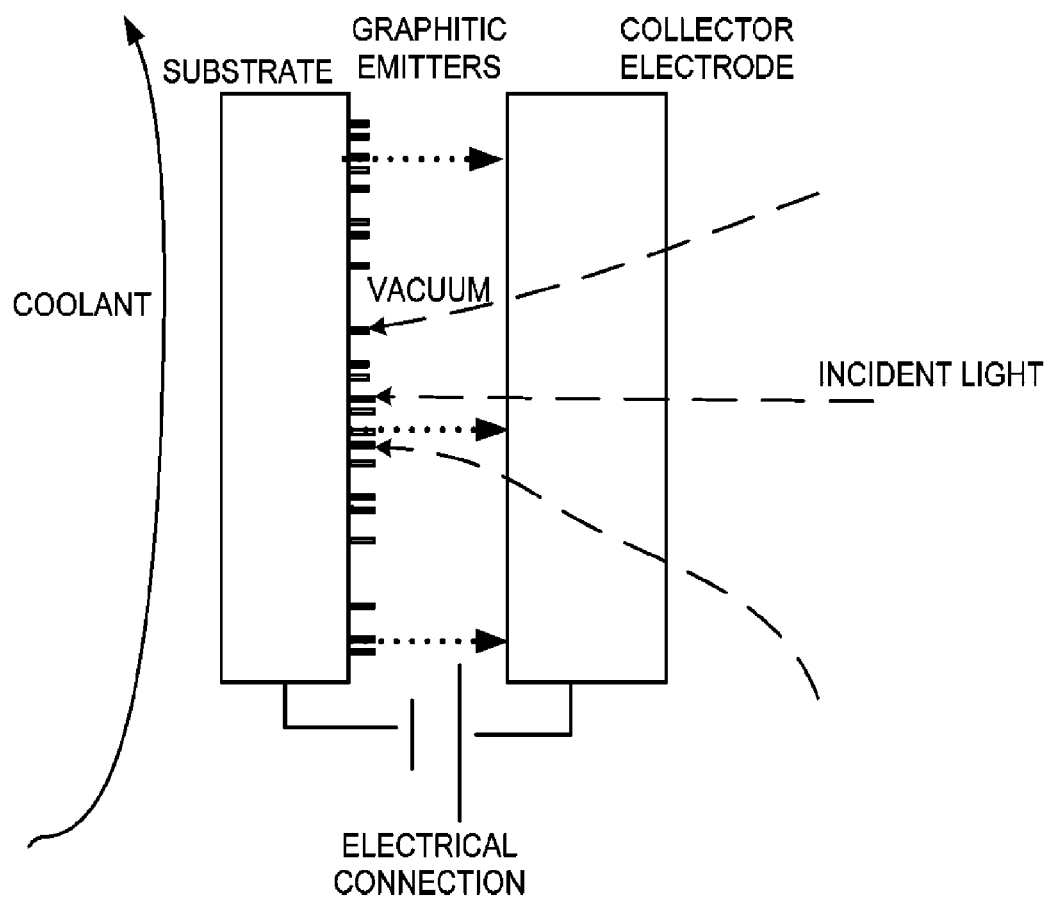
FIG. 3A-1 is a cross-sectional schematic representation of a heat exchanger according to one embodiment of the present disclosure illustrating a cooling process according to one embodiment of the present disclosure.
Figures 2, 3A:
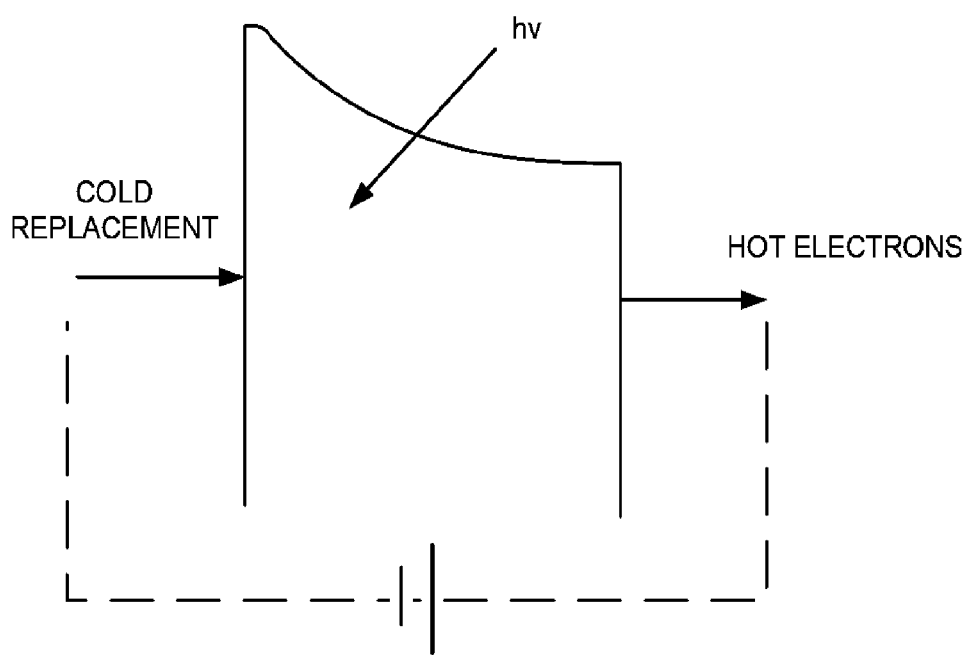
Figure 3B:
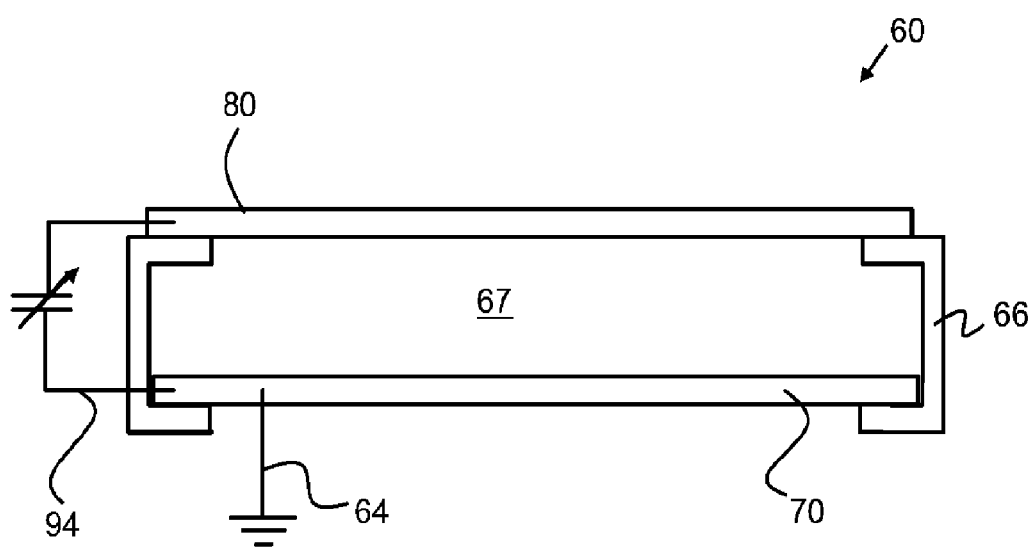
FIG. 3B is another schematic representation of a heat exchanger according to another embodiment of the present disclosure.

As is illustrated in FIGS. 3A-1 and 3B, one embodiment of the present disclosure pertains to processes that provide, with the aforementioned understandings, a cooling phenomenon. The process of emitting electrons with very high energies can be used to create a cooling effect in the emitting material. In other words, the high energy electrons are removed out of the graphene-based materials and then are received in a collecting electrode. It is envisioned that the electrons may traverse through vacuum or may traverse through vacuum with trace amounts of intercalant gas. As is illustrated in FIGS. 3A-1 and 3B collecting electrode may be optically transparent in some manifestations of the disclosure.

High energy emitting electrons are replaced by low-energy electrons near the electrochemical potential of the emitter in order to conserve charge. Thus, the net energy exchanged by an emitting and replacing pair of electrons is negative. High energy emitting electrons carry net thermal energy away from the emitter producing a refrigerating effect at the emitter. As an additional advantage of this system, this continuous cycle of electron replenishment obviates the need for regeneration of the absorbate as used in some absorption cooling systems. As with all refrigeration cycles, the cooling effect at the evaporating side is offset by a heating effect at the condensing side; therefore, the collecting electrode's temperature would become elevated. However, collecting electrode heating occurs at a place that may be separated by a good thermal insulator, such as vacuum. Due to use of a good thermal insulator, thermal backflow losses are expected to be relatively small as compared to, for example, thermoelectric coolers.

A sketch of the central concept involving concentrated solar irradiation is shown in FIGS. 3A-1 and 3B. The envisioned process according to one embodiment of the present disclosure, and as shown in FIGS. 3A-1 and 3B, includes a coolant fluid that passes across the refrigerated emitter. This coolant fluid delivers cooling to elements that require low temperatures—possibilities include heat exchangers in HVAC systems, electronic components, and refrigeration units for perishable items. The heated collector side is cooled by conventional fans or cooling liquids. We also note here the use of an optional and supplemental electrical power supply that can manipulate the cooling effect by changing the relative electrochemical potentials of the emitter and collector. We also have conceived of the use of a thermoelectric power generator attached to the heated collector side to scavenge some of its waste heat in order to provide this supplemental electrical power. As shown in FIG. 5, the use of light concentration, by any means ranging from parabolic mirrors to microlenses, can enhance this effect (noting the non-linearity of FWHM with increasing light intensity in the graph above). The parabolic mirror concept would by necessity be voluminous but could capture more total light, whereas the microlens array would be very compact and could enhance the local absorption of light to create even higher electron temperatures that would improve thermodynamic efficiency and capacity.

Figure 4:
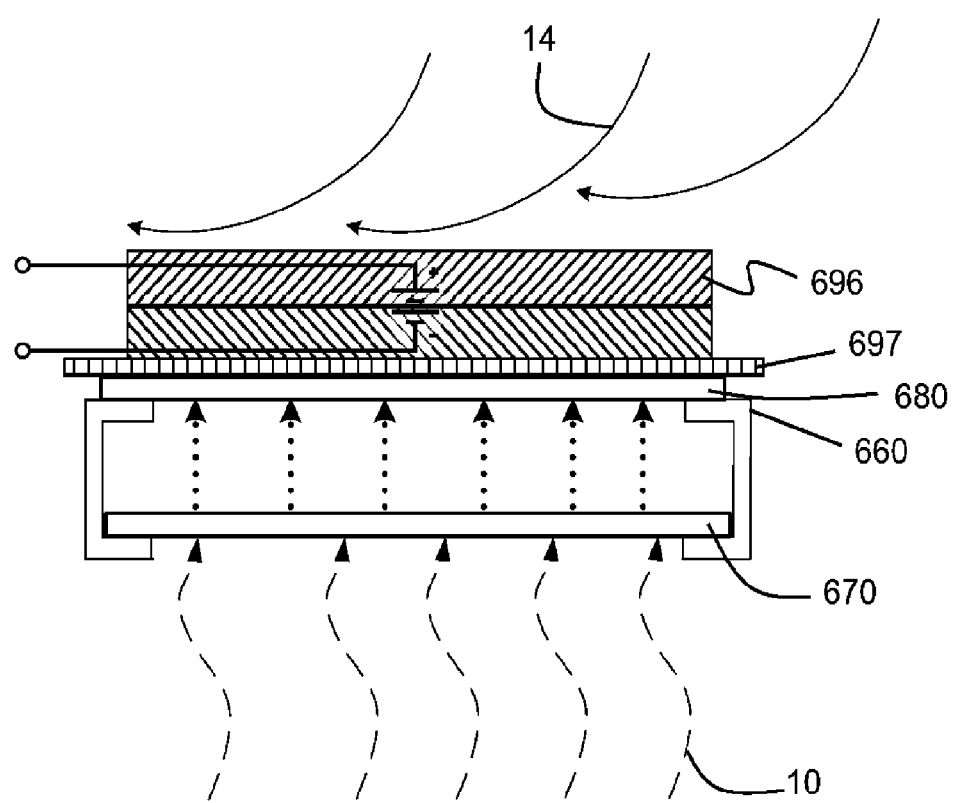
FIG. 4 is a cross-sectional schematic representation of a heat exchanger according to another embodiment of the present disclosure.

Some embodiments of the present disclosure could be used to provide cold air conditioning in remote, rural, or impoverished areas that either have no or unreliable electrical power source. To make the concept fully independent of external electrical power, a simple solid-state thermoelectric generator could be added to the heated collector as shown in FIG. 4.

One advantage of this approach is that it could use common, inexpensive materials relative to most photovoltaic power generators which require a separate refrigeration unit. This approach has no requirement for complex mechanical parts such as a compressor or fluid flow elements such as a condenser, evaporator, valves, or seals. We envision the use of modules that are attached like window air conditioning units, although they would be much thinner, lighter, and less bulky. If high efficiency could be achieved, then large-scale commercial markets would open to this approach such as home cooling and rooftop solar-AC panels for hybrid cars.

Fluid-based absorption refrigeration is undergoing a mild resurgence with increased public attention to energy efficiency. The use of photovoltaics coupled with refrigeration units is possible. One aspect with this approach is that the many losses exist in the many energy conversion processes, which also require several types of technologies and can be expensive. In particular, solar light can be considered a low-potential/high-current DC energy source. However, rotator machines such as compressors are moderate-potential/moderate-current AC energy devices. Finally, the actual cooling process can be considered to be low-potential/high-current, just as was the original solar energy. As a result of this incongruence, the photovoltaic-to-refrigeration route is inefficient; however, the present disclosure retains the low-potential/high-current nature of these phenomena.

The most recent work related to this effort has focused on further chemical and physical modifications of the nanoemitter material in order to increase electron emission intensity and limit deintercalation of potassium in the graphite lattice.

We have already shown that a non-equilibrium electron state is present with potassium intercalated graphene petals, which will allow for very high-energy emitted electrons. Two main modifications of the current emitter arrays are envisioned and in development. First, the doping of boron nitride modified carbon, $C_x(BN)$ is envisioned. This process involves the heating of the carbon sample, for example by microwave, in the presence of solvated boric acid and urea. The solvent can be either water or methanol. BN modified petals may offer the possibility of an enhanced non-equilibrium state of the electrons owing to a high density of domain boundaries between carbon and BN. This process also has the potential benefit of minimizing potassium deintercalation via reduced mobility of potassium atoms within the graphite lattice. The graphene petals may be modified by a microwave-assisted acid treatment of equal parts boric and urea acids, followed by annealing in a high temperature nitrogen environment. Electron emission experiments are envisoned to compare non-modified petals to the $C_x(BN)$ structures.

Chemical vapor deposition has shown promise for large scale synthesis of doped large-area graphene films. Microwave plasma CVD (MPCVD) is another promising technique that has been widely used for low-temperature and fast growth of different carbon based nanostructures including flat graphene films and graphene flakes. The coupling between methane/hydrogen plasma and a metal foil in the MPCVD process enabled a very rapid and localized heating of the metal foil to produce graphene growth within a few minutes without any supplemental heating. Because of this localized heating on a thermally light substrate (i.e., an elevated foil), the cooling process was also shown to be extremely fast.

The second variation of the emitter array will be the growth of graphene petals on carbon nanotube (CNT) arrays. Petal coated CNTs generate a very high surface area emitter array with high electrical and thermal transport. This material type may offer an increased current density.

Figure 7:
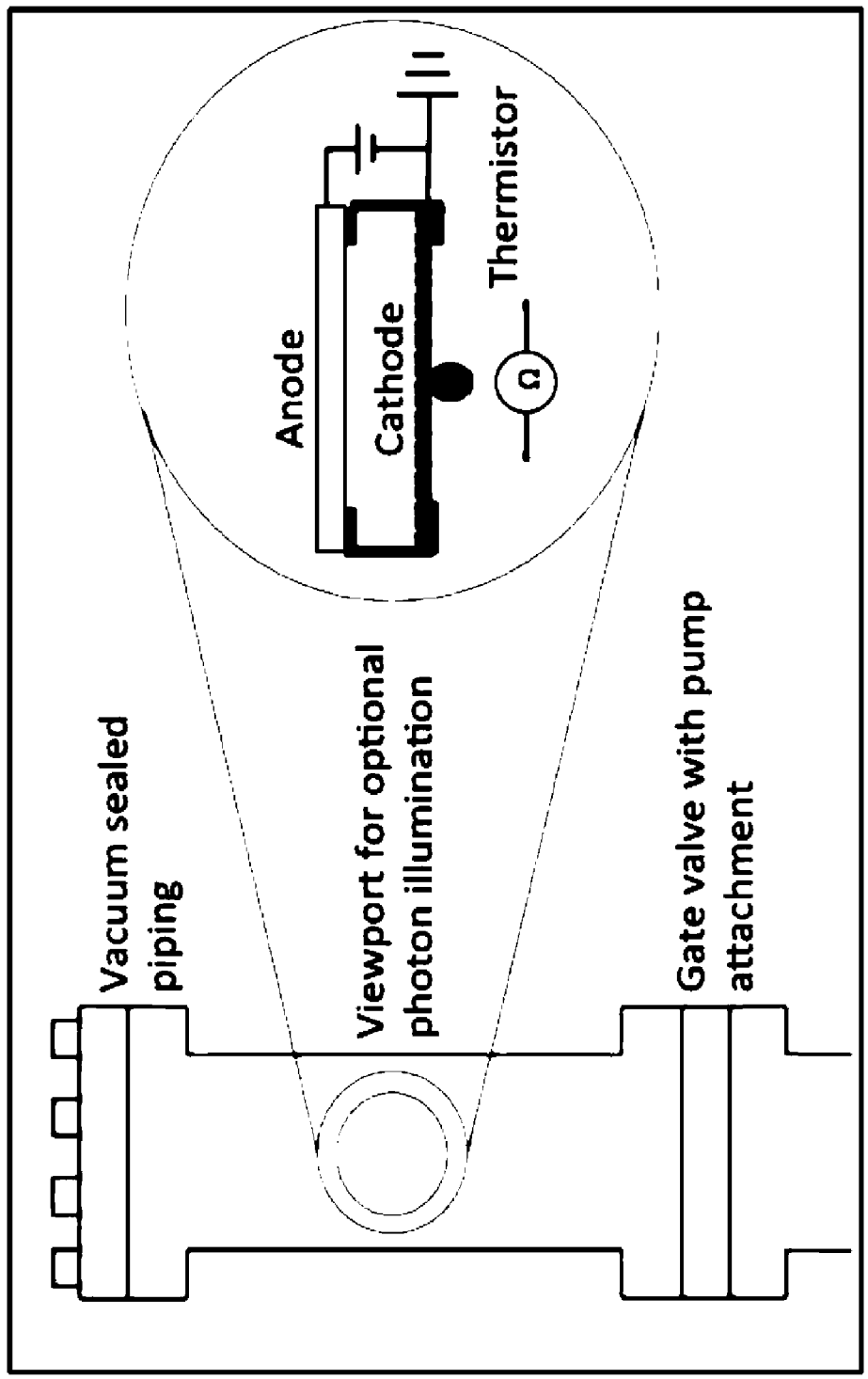
FIG. 7 is a schematic of a multi-stage photo-field emission device for solar-based refrigeration according to one embodiment of the present disclosure.

In parallel to this work, an experimental testing rig for measuring electronic cooling is being developed. A self-contained current density testing system is envisioned and in development similar to what is shown in FIG. 7. The testing rig is a small pipe or box that has a viewport for solar illumination, and gate valve with flange for attaching to an external pump. Within the emission testing system, a simple circuit including a thermally isolated cathode and anode arrays is present with a thermocouple for measuring temperature changes in the cathode during electron emission. Some possible additions to this design may be a thermocouple on the anode, and a heater attached to the cathode. The reason for developing a small, self-contained testing device is due to known concerns with potassium intercalation. Potassium is known to have a very volatile reaction with oxygen and water vapor. Potassium will readily oxidize in air limiting the efficiency of the cathode material during emission. Potassium intercalation needs to be performed in an inert environment (argon or nitrogen), after which the small testing rig allows for building of the circuitry within a glove box containing an equally inert environment. Once the sample is intercalated and loaded into the field emission testing rig, the gate valve keeps the rig sealed until an external pump is attached and the system is pumped to vacuum.

FIG. 3B is a cross-sectional schematic representation of a heat exchanger according to one embodiment of the present disclosure. Heat exchanger 60 includes a cathode 70 and an anode 80 spaced apart by a member 66. Member 66 maintains a gap 67 between the inner surface of cathode 70 and the inner surface of anode 80. In some embodiments, member 66 is fabricated from a material that is both electrically insulating and thermally isolating, so as to maintain thermal and electrical isolation between anode 80 and cathode 70.

Preferably, in a three-dimensional structure gap 67 represents an enclosed volume. In some embodiments, the volume between cathode 70 and anode 80 is evacuated and substantially void of matter. However, in yet other embodiments, the vacuum within this interior volume includes some amount of the substance that is intercalated into the graphite of cathode 70. Preferably, this additional amount of the substance is in a gaseous phase, although other embodiments contemplate the substance being in a non-gaseous state and adsorbed onto any of the boundaries (cathode inner surface, anode inner surface, and spacing member inner surfaces) of the volume. In still further embodiments, spacing member 66 includes a fluid communication port, through which additional amounts of the intercalated substance can be provided during the life of the heat exchanger, and further, through which the amount of vacuum within the interior can be adjusted.

Preferably, the spacing 67 is generally uniform between opposing planar inner surfaces of the cathode and anode. However, in yet other embodiments, the present disclosure contemplates nonplanar cathodes, nonplanar anodes, and further contemplates nonuniform separations between the cathode and anode. As one example, in some embodiments, cathode 70 has a generally cylindrical cross-sectional shape, and is generally surrounded by an anode having a generally cylindrical cross-sectional shape.

Further, the plan shape of heat exchanger 60 can be of any type. In some embodiments, the plan shape (i.e., the shape that would be seen looking down in FIG. 3B) is rectangular, whereas in other embodiments it is circular, and generally is unconstrained in terms of its plan shape. Further, although discrete heat exchangers are shown and discussed herein, it is further contemplated that these heat exchangers can be distributed and integrated into the overall design of a product, providing heat transfer to that product at the distributed and discrete locations.

Cathode 70 includes graphite that is intercalated with a substance that lowers the work function of some of the electrons of the cathode graphite. In some embodiments, the graphite includes graphene petals, whereas in other embodiments the graphite includes carbon nanotubes. Yet further embodiments contemplate the use of buckyballs or any form of nanodimensional carbon. Preferably, the graphite is in overall thermal equilibrium with the outer surface of cathode 70, and further at substantially the same electrical potential as the outer surface of cathode 70.

However, as previously described, the intercalation of a substance within the graphite causes some regions of the graphite to be in substantial non-equilibrium. In some embodiments, the intercalated substance lowers the work function of one or more nearby electrons within the lattice of the graphite, and these electrons are not in thermal equilibrium with the local latticework. As discussed earlier, these nonequilibrium electrons are hotter than their surrounding carbon lattice.

Anode 80 preferably includes a layer of graphite on the inner surface. In some embodiments, this inner surface of graphite has a line of sight to the inner surface of cathode 70. Therefore, as the nonequilibrium electrons are emitted from cathode 70, the transport directly and by shortest distance to anode 80. However, yet other embodiments, the present disclosure contemplates one or more electromagnetic devices within heat exchanger 60 (such as within separating member 66) that can be used to change the transport path of the non-equilibrium electrons after being emitted by cathode 70. For example, separating member 66 can include one or more electromagnets that can be used to concentrate a transporting, nonequilibrium electrons to various locations on anode 80 (such as concentrating toward the center, or concentrating toward the edges, as examples).

Preferably, anode 80 is at least partially transparent to wavelengths of radiation that can excite the non-equilibrium electrons of cathode 70 to emit. For example, in some embodiments, it is thought that the non-equilibrium electrons have a work function of from about 2 to about 2½ electron volts. Correspondingly, anode 80 in such an embodiment is able to transmit light in the visible spectrum, such as from about 500 nm to about 600 nm.

In some embodiments, it is envisioned that radiation falls incident upon the surface of cathode 70 that is arranged opposite to a receiving surface of anode 80, and radiation is received upon the cathode after the radiation passes through the anode. However, in yet other embodiments, it is contemplated that the source of radiation can be located within interior 67, such as a radiation source supported by separating member 66, and provided with an external source of excitation. For example, the external source of excitation can be a voltage that stimulates a light source placed within interior volume 67, whereas in other embodiments, the excitation is an external source of light that is provided by way of fiber-optic cable into interior 67. Still further, in some embodiments, separating member 66 is chosen to be substantially transparent to the source of radiation, such that the radiation can be located somewhat laterally to device 60 (with reference to FIG. 3B).

In some embodiments, heat exchanger 60 includes a voltage source 94 that maintains a predetermined electrical potential between anode 80 and cathode 70. In some embodiments, voltage source 94 is a battery. In yet other embodiments, voltage source 94 is a source of variable DC voltage. In still other embodiments, voltage source 94 provides a variable DC voltage that can be modulated based on measured parameters, such as the amount of radiation is falling incident on cathode 70 (such as would be measured by a photometer), the temperature of the cathode or anode (such as would be measured by a thermocouple), by the temperature of the structure being heated or cooled (such as by thermocouple), or some parameter associated with the operation of the product being heated or cooled by heat exchanger 60.

Figure 3C:
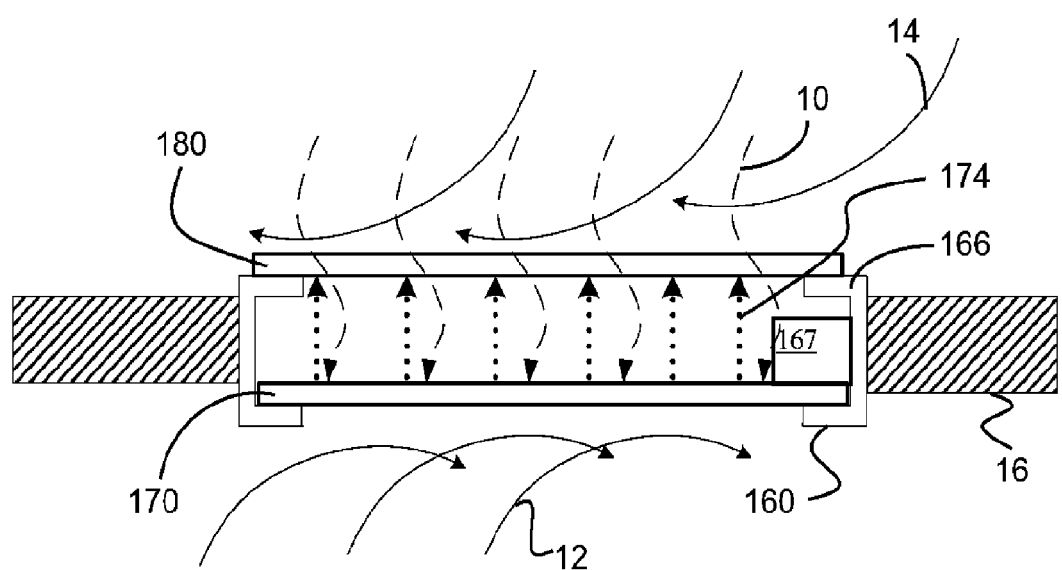
FIG. 3C is a cross-sectional schematic representation of a heat exchanger according to another embodiment of the present disclosure.

FIG. 3C is a schematic depiction of a heat exchanger 160 in operation. Heat exchanger 160 is located within a panel 16. Panel 16 and heat exchanger 160 coact to generally separate a cathode side ambient 12 from and anode side ambient 14. The curved arrows of FIG. 3C depict the convection of a gas (such as air) that impinges upon the outer surface of cathode 170. Likewise, the curved arrows of FIG. 3C further depict the convection of a gas (such as air) that impinges upon the outer surface of anode 180. For purposes of clarity, FIG. 3C does not include depiction of a source of electrical voltage, nor does it depiction connection of the cathode to an electrical ground.

FIG. 3C shows radiation 10 falling incident upon the outer surface of anode 180, passing through the anode, and being received on the inner surface of cathode 170. As this energy (for the case of visible light, photons) strikes a non-equilibrium electron 174, that electron is emitted from cathode 170 and transports through internal gap 167 and is received by anode 180. This nonequilibrium electron 174, which was hotter than its surrounding carbon lattice of cathode 170, carries this heat from cathode 170 to anode 180. As a result, the overall energy (and overall bulk temperature) of cathode 170 is reduced and cathode 170 becomes cooler. Likewise, this transfer of heat by way of electron 174 causes an increase in the thermal energy of anode 180, with a subsequent increase in the temperature of anode 180.

As a result of radiation 10 falling incident upon cathode 170, cathode 170 becomes cooler. The cathode side convective currents 12 provide heat from cathode side ambient conditions into the cathode, with subsequent cooling of the cathode side ambient. This heat is likewise transferred to the anode side ambient conditions by way of anode side convective currents 14.

Figure 3D:
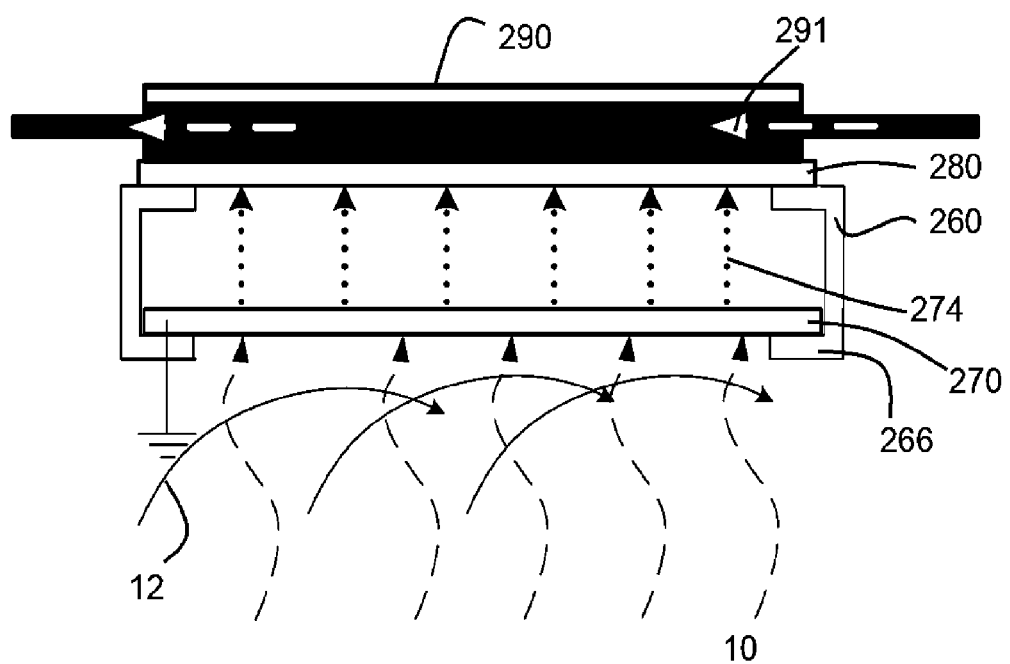
FIG. 3D is a cross-sectional schematic representation of a heat exchanger according to another embodiment of the present disclosure.

FIG. 3D is a schematic representation of a heat exchanger 260 according to another embodiment of the present disclosure. Heat exchanger 260 includes a cathode 270 that is substantially transparent to the wavelengths of radiation that can excite electrons 274 to emit. FIG. 3D shows radiation 10 falling incident upon the outer surface of cathode 270, through which radiation 10 is received by the nonequilibrium electrons 274. These electrons emit and transport through 267 to anode 280.

The heat received by the anode can be removed in any manner. As shown in FIG. 3D, heat from anode 280 is conducted into the working fluid 291 of the flow path of an anode side heat exchanger 290. The hotter working fluid 291 exiting toward the left of FIG. 3D is received within a structure (not shown) that dumps the heat to anode side ambient conditions. In some embodiments, the working fluid 291 is actively pumped through a 2nd heat exchanging loop (heat exchanger 260 being the 1st heat exchanger). In some embodiments, the working fluid 291 can contain nanoparticles to further enhance the pickup of heat from anode 280, and may be pumped actively (such as by a pump, electromagnetically, or electrophoretically, as examples), or by passive convection within heat exchanger 290.

Figure 3E:
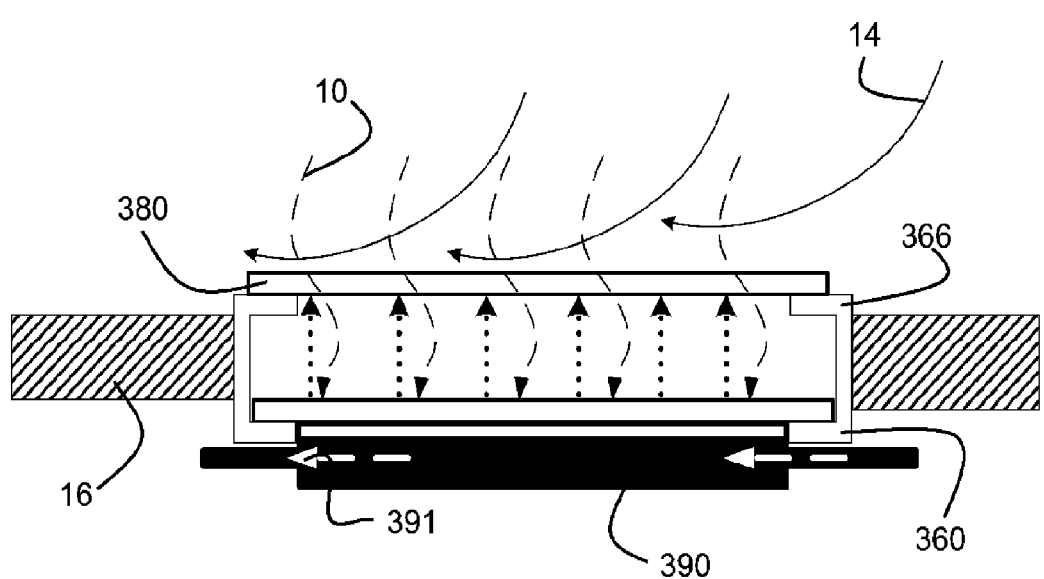
FIG. 3E is a cross-sectional schematic representation of a heat exchanger according to another embodiment of the present disclosure.

FIG. 3E shows a heat exchanger 360 in yet another embodiment of the present disclosure. Heat exchanger 360 is arranged similarly to that of heat exchanger 60 in FIG. 3B, but includes a 2nd heat exchanging loop 390 that includes a working fluid 391 that provides heat to cathode 370 (which is the same as to say that working fluid 391 is cooled by cathode 370).

FIG. 4 is shows a heat exchanger 660 according to another embodiment of the present disclosure heat exchanger 660 includes a 1st heat exchanger similar to that shown in FIG. 3-D. Radiation 10 falls incident upon the outer surface of cathode 670 and excites nonequilibrium electrons 674 to transfer heat to anode 680. This heat is further transferred in one embodiment by conduction through an electrical isolating substrate 697 into a thermal electric generator 696. Generator 696 provides electrical power (as represented by the symbology in FIG. 4) in response to being heated. This electrical power, provided to the positive and negative contacts of generator 696, can be used in any manner. In some embodiments, this electrical power is used to assist in the flow of heat into cathode 670, or into the flow of heat out of anode 680. It is further appreciated that generator 696 can be cooled by contact with anode side ambient conditions 14.

Figure 5A:
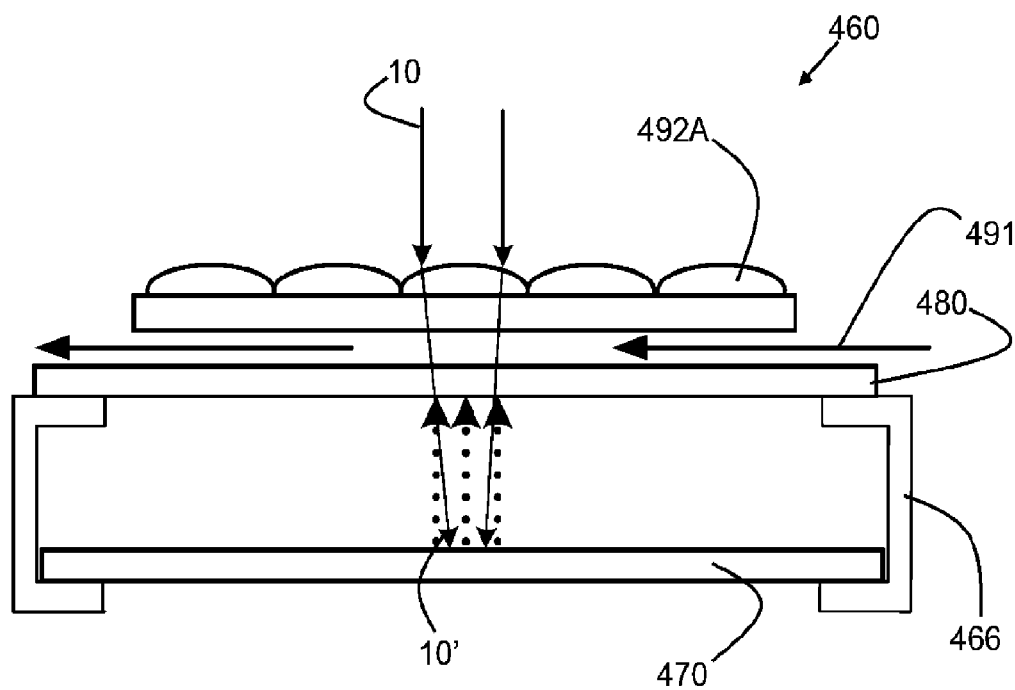
FIG. 5A is a cross-sectional schematic representation of a heat exchanger according to another embodiment of the present disclosure.

FIG. 5A shows a heat exchanger 460 that includes means for 92 for concentrating radiation upon cathode 470. For those embodiments in which radiation is received through the anode side, a micro lens array 492 receives radiation 10 from a source and concentrates that radiation into a pattern 10' upon the inner surface of cathode 470. This concentrated pattern 10' likewise provides electrons 474 that are emitted toward cathode 480, with subsequent heating of cathode 480. Cooling of the anode side can be accomplished in any manner, including the passage of a fluid between micro lens 492A and anode 480.

In some embodiments, cathode 470 is adapted and configured to include distinct regions that are intercalated with the substance (or relatively intercalated more with the substance than surrounding regions), and these distinct regions receive the concentrated radiation pattern 10'. Further, although micro lens 492 has been shown substantially planar, it is recognized that various configurations of micro lens arrays are contemplated, including curved arrays with larger surface areas for receipt of radiation. Further, it is understood that one or more micro lenses can be incorporated into separating member 466.

Figure 5B:
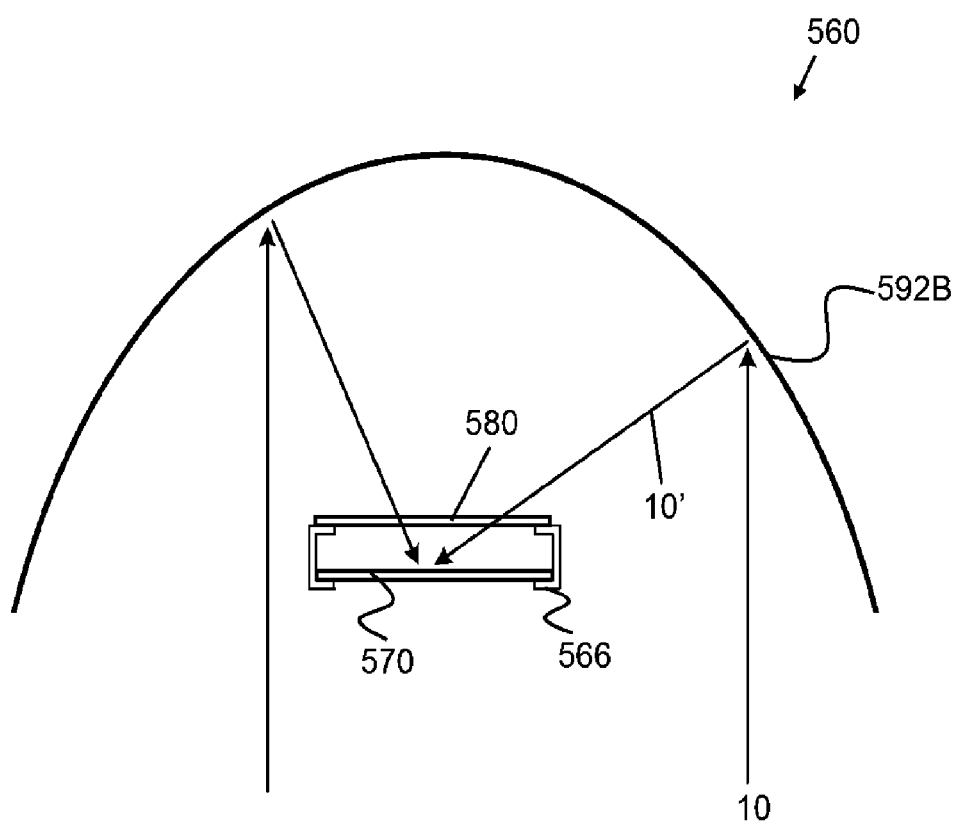
FIG. 5B is a cross-sectional schematic representation of a heat exchanger according to another embodiment of the present disclosure.

FIG. 5B shows a heat exchanger assembly 560 in which the anode, cathode, and separating member are received within a curved it is radiation reflector, such as a parabolic mirror 592B. Radiation received upon the inner surface of reflector 592B is reflected through anode 580 and on to cathode 570. It is appreciated that in any of these embodiments described, of that radiation can be received through the anode or through the cathode.

X1. One aspect of the present disclosure pertains to an apparatus for transferring heat activated by radiation. The method preferably includes a cathode comprising a substrate of graphite, the graphite being intercalated with an alkali metal, the cathode graphite having a plurality of electrons that are not in thermal equilibrium with the cathode graphite lattice, said cathode having opposing inner and outer surfaces. The apparatus preferably includes an anode comprising a substrate of graphite, wherein substantially all of the electrons of the anode graphite are in thermal equilibrium with the anode graphite lattice, said anode having opposing inner and outer surfaces. The apparatus preferably includes a member maintaining a gap between said cathode inner surface and said anode inner surface, said member being substantially non-conductive of electricity, wherein the transfer of from said cathode to said anode is activated by reception of the radiation on said cathode.

Yet other embodiments pertain to any of the previous statements X1 which are combined with one or more of the following other aspects:

Wherein the substrate of graphite of the cathode includes a plurality of graphene petals and/or the substrate of graphite of the cathode includes a plurality of carbon nanotubes.

Wherein the alkali metal is potassium.

Wherein the intercalated alkali metal lowers the work function of the non-equilibrium electrons and/or the non-equilibrium electrons have a work function that is less than about 3 electronvolts.

Wherein the non-equilibrium electrons have a work function within a range of electron voltages, and the radiation is within a spectrum of wavelengths corresponding to the range of electron voltages.

Wherein the work function is less than about 3 electronvolts and the spectrum includes radiation from about five hundred to about six hundred nanometers.

Wherein the reception of radiation causes the non-equilibrium electrons to be emitted from said cathode, and said cathode is adapted and configured such that the non-equilibrium electrons are emitted from the inner surface of said cathode and toward the inner surface of said anode.

Wherein said cathode becomes cooler and said anode becomes hotter.

Wherein the source of radiation is the sun, and/or which further comprises a source of radiation, and/or wherein the source is a laser.

Wherein said cathode, said anode, and said member combine to form an interior volume that is coextensive with the gap, and the interior volume is substantially void of matter.

Wherein said anode is at least partially transparent to the radiation, and radiation incident upon the outer surface of said anode is transmitted through said anode and is received on the inner surface of said cathode.

Which further comprises means for removing heat from said anode and/or which further comprises means for adding heat to said cathode.

Which further comprises a source of electrical potential, said source being in electrical communication with said anode and said cathode, said source establishing an electrical potential between said anode and said cathode.

Wherein said source is a source of variable electrical potential.

While the disclosures have been illustrated and described in detail in the drawings and foregoing description, the same is to be considered as illustrative and not restrictive in character, it being understood that only certain embodiments have been shown and described and that all changes and modifications that come within the spirit of the disclosure are desired to be protected.

What is claimed:

1. A material comprising:
a carbon allotrope doped with boron nitride and
an alkali metal intercalated within the carbon allotrope.

2. The material of claim 1, wherein the carbon allotrope is selected from the group consisting of graphene and graphite.

3. The material of claim 2 wherein the graphite is graphite petals.

4. The material of claim 3 wherein the graphite petals are nanoscale thin.

5. The material of claim 2 wherein the graphene is multi-layer graphene petals.

6. The material of claim 5 wherein graphene is modified by a microwaveassisted acid treatment.

7. The material of claim 6 wherein the graphene is annealed in a high temperature nitrogen environment.

8. The material of claim 3 further comprising graphene petals on carbon nanotube arrays.

9. The material of claim 6 wherein the acid treatment includes at least one of boric acid or urea acid.

* * * * *